US010283404B2

United States Patent
Na et al.

(10) Patent No.: US 10,283,404 B2
(45) Date of Patent: May 7, 2019

(54) SELECTIVE DEPOSITION OF WCN BARRIER/ADHESION LAYER FOR INTERCONNECT

(71) Applicant: Lam Research Corporation, Fremont, CA (US)

(72) Inventors: Jeong-Seok Na, Fremont, CA (US); Megha Rathod, Fremont, CA (US); Chiukin Steven Lai, Sunnyvale, CA (US); Raashina Humayun, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/474,383

(22) Filed: Mar. 30, 2017

(65) Prior Publication Data

US 2018/0286746 A1    Oct. 4, 2018

(51) Int. Cl.
| | |
|---|---|
| *H01L 21/768* | (2006.01) |
| *H01L 21/02* | (2006.01) |
| *C23C 16/455* | (2006.01) |
| *C23C 16/36* | (2006.01) |

(Continued)

(52) U.S. Cl.
CPC ........ *H01L 21/76843* (2013.01); *C23C 16/36* (2013.01); *C23C 16/45536* (2013.01); *H01L 21/0228* (2013.01); *H01L 21/02175* (2013.01); *H01L 21/76844* (2013.01); *H01L 21/76865* (2013.01); *H01L 21/76879* (2013.01); *H01L 23/5226* (2013.01); *H01L 23/5329* (2013.01)

(58) Field of Classification Search
CPC ......... H01L 21/76844; H01L 21/76865; H01L 21/76843; H01L 21/0228; H01L 23/5329; H01L 23/5226; H01L 21/76879; C23C 16/36; C23C 16/45536
See application file for complete search history.

(56) References Cited

U.S. PATENT DOCUMENTS

| | | | |
|---|---|---|---|
| 5,950,108 | A | 9/1999 | Wu et al. |
| 6,008,117 | A | 12/1999 | Hong et al. |
| 6,077,774 | A | 6/2000 | Hong et al. |

(Continued)

FOREIGN PATENT DOCUMENTS

WO    WO 2012168248 A1 * 12/2012    ........ C23C 16/45555

OTHER PUBLICATIONS

Besling et al, Atomic Layer Deposition of Barriers for Interconnect, 2002, IEEE, Interconnect Technology Conference, p. 288-291.*

(Continued)

*Primary Examiner* — Joseph C. Nicely
(74) *Attorney, Agent, or Firm* — Weaver Austin Villeneuve & Sampson LLP

(57) ABSTRACT

Provided are methods of forming diffusion barriers and adhesion layers for interconnects such as cobalt (Co) interconnects or ruthenium (Ru) interconnects. The methods involve selective deposition of tungsten carbon nitride (WCN) films on the oxide surfaces of a feature including a Co surface. The selective growth of WCN on oxide allows the contact resistance at an interface such as a Co—Co interface or a Co—Ru interface to be significantly reduced while maintaining good film coverage, adhesion, and/or barrier properties on the sidewall oxide surfaces.

20 Claims, 9 Drawing Sheets

(51) Int. Cl.
*H01L 23/522* (2006.01)
*H01L 23/532* (2006.01)

(56) References Cited

U.S. PATENT DOCUMENTS

| | | | |
|---|---|---|---|
| 6,553,933 B2 | 4/2003 | Powell et al. | |
| 6,616,985 B2 | 9/2003 | Powell et al. | |
| 6,794,288 B1 | 9/2004 | Kolics et al. | |
| 6,878,402 B2 | 4/2005 | Chiang et al. | |
| 6,905,543 B1 | 6/2005 | Fair et al. | |
| 7,368,377 B2 | 5/2008 | Whelan et al. | |
| 7,727,882 B1 | 6/2010 | Wu et al. | |
| 8,192,806 B1 | 6/2012 | Varadarajan et al. | |
| 8,975,184 B2 | 3/2015 | Chen et al. | |
| 9,418,889 B2 | 8/2016 | Mountsier et al. | |
| 9,953,984 B2 | 4/2018 | Danek et al. | |
| 9,969,622 B2 | 5/2018 | Lei et al. | |
| 2004/0071878 A1* | 4/2004 | Schuhmacher | C23C 14/04 427/255.28 |
| 2004/0202786 A1 | 10/2004 | Wongsenahum et al. | |
| 2005/0020058 A1* | 1/2005 | Gracias | B82Y 30/00 438/643 |
| 2005/0064708 A1* | 3/2005 | May | H01L 21/76844 438/687 |
| 2005/0142858 A1* | 6/2005 | Han | H01L 21/76807 438/638 |
| 2008/0122101 A1* | 5/2008 | Oku | H01L 21/2855 257/762 |
| 2009/0163025 A1 | 6/2009 | Humayun et al. | |
| 2009/0246952 A1* | 10/2009 | Ishizaka | C23C 16/34 438/653 |
| 2010/0120245 A1 | 5/2010 | Tjandra et al. | |
| 2010/0227476 A1* | 9/2010 | Peck | C23C 16/40 438/680 |
| 2010/0239765 A1* | 9/2010 | Winter | C07F 11/00 427/372.2 |
| 2014/0120681 A1* | 5/2014 | Chang | H01L 29/4983 438/301 |
| 2014/0193983 A1* | 7/2014 | LaVoie | C23C 16/45529 438/778 |
| 2015/0380302 A1* | 12/2015 | Mountsier | H01L 21/76831 438/654 |
| 2016/0002784 A1* | 1/2016 | Omstead | C23C 16/45536 427/523 |
| 2016/0027738 A1* | 1/2016 | Murray | H01L 23/53295 257/751 |
| 2016/0163586 A1* | 6/2016 | Siew | H01L 21/76844 438/653 |
| 2016/0163645 A1* | 6/2016 | Kamineni | H01L 23/5226 257/751 |
| 2016/0309596 A1* | 10/2016 | Shaviv | C25D 7/123 |
| 2016/0351444 A1* | 12/2016 | Schloss | H01L 21/76876 |
| 2016/0358859 A1* | 12/2016 | Murray | H01L 21/76805 |
| 2016/0365271 A1* | 12/2016 | Chang | H01L 21/76807 |
| 2016/0379881 A1* | 12/2016 | He | H01L 21/76897 257/774 |
| 2017/0053876 A1* | 2/2017 | Wu | H01L 23/53266 |
| 2017/0092536 A1* | 3/2017 | Yang | H01L 21/76855 |
| 2017/0117218 A1* | 4/2017 | Liu | H01L 21/76804 |
| 2018/0033683 A1* | 2/2018 | Murray | H01L 21/76846 |
| 2018/0033728 A1* | 2/2018 | Zhang | H01L 23/5283 |
| 2018/0053844 A1* | 2/2018 | Bi | H01L 29/7827 |
| 2018/0082946 A1* | 3/2018 | Clevenger | H01L 23/53204 |
| 2018/0119305 A1* | 5/2018 | Brogan | C25D 7/123 |
| 2018/0122696 A1* | 5/2018 | Shaviv | H01L 21/76879 |
| 2018/0219014 A1 | 8/2018 | Danek et al. | |

OTHER PUBLICATIONS

Detavernier et al, Thermal versus plasma-enhanced ALD: growth kinetics and conformality, ECS Transactions, 16 (4), 2008, pp. 239-246.*
Office Action dated Jan. 15, 2016, issued in U.S. Appl. No. 14/742,180.
Notice of Allowance Action dated Apr. 28, 2016, issued in U.S. Appl. No. 14/742,180.
Office Action issued in U.S. Appl. No. 15/040,561, dated Aug. 18, 2016.
Final Office Action issued in U.S. Appl. No. 15/040,561, dated Dec. 30, 2016.
Office Action issued in U.S. Appl. No. 15/040,561, dated Jul. 17, 2017.
Notice of Allowance issued in U.S. Appl. No. 15/040,561, dated Dec. 19, 2017.
Office Action issued in U.S. Appl. No. 15/925,579, dated Sep. 21, 2018.
U.S. Appl. No. 15/640,068, filed Jun. 30, 2017, Khare, et al.

* cited by examiner

| 40 Angstrom CVD Co |
| 30 Angstrom WCN |
| 40 Angstrom CVD Co |
| 30 Angstrom WCN |
| 40 Angstrom CVD Co |
| 30 Angstrom WCN |
| native oxide |
| Si |

SELECTIVE DEPOSITION OF WCN BARRIER/ADHESION LAYER FOR INTERCONNECT

BACKGROUND

In semiconductor fabrication, features may be filled with conductive materials. For example, copper is used for back end of line (BEOL) interconnects. However, copper interconnects are challenging to fabricate beyond the 7 nm technology node. Deposition of copper interconnects often involves first depositing a barrier layer. However, a barrier material which maintains its integrity as its thickness is scaled below 2.5 nm has not been identified. As the linewidth scales to 10 nm (at the 5 nm technology node), the barrier will consume 5 nm of the linewidth and more than 50% of the line cross-section, increasing the resistance exponentially with each technology node beyond 10 nm. Additionally, copper has an electron mean free path of about 39 nm. As a result, in small critical dimension features, electrons hit the sidewalls resulting in a less elastic collision. One alternative to copper interconnects is cobalt. Cobalt has an electron mean free path of about 6 nm and has low resistivity.

SUMMARY

One aspect of the disclosure relates to a method involving: providing a substrate including a feature having a feature bottom and feature sidewalls, wherein the feature bottom includes an cobalt surface and the feature sidewalls include silicon oxide surfaces; and performing multiple cycles of an atomic layer deposition (ALD) process to deposit a tungsten carbon nitride (WCN) film to line the feature sidewalls, wherein a thickness of the WCN film on the silicon oxide surfaces of the feature sidewalls is at least twice as thick as a thickness of the WCN film on the cobalt surface of the feature bottom.

In some embodiments, the thickness of the WCN film on the silicon oxide surfaces of the feature sidewalls is at least five times as thick as the thickness of the WCN film on the cobalt surface of the feature bottom.

In some embodiments, the method further involves prior to performing the multiple cycles of the ALD deposition process, exposing the feature to a hydrogen-containing plasma. In some such embodiments, the method further involves after exposing the feature to the hydrogen-containing plasma and prior to performing the multiple cycles of the ALD deposition process, exposing the feature to a nitrogen-containing plasma.

In some embodiments, the method includes, after depositing the WCN film, filling the feature with a metal. Examples of fill metals include cobalt or ruthenium.

In some embodiments, the feature includes a feature opening and the substrate includes a field region adjacent to the feature opening, the field region having a silicon oxide surface. In some such embodiments, the ALD process deposits the WCN film on the silicon oxide surface of the field region. A thickness of the WCN film on the silicon oxide surface of the field region is no more than 30% greater than a thickness of the WCN film on a silicon oxide surface of the feature sidewalls in some embodiments.

In some embodiments, a thickness of the WCN film on the feature sidewalls varies no more than about 20%.

In some embodiments, each cycle of the ALD process includes introducing a pulse of a nitrogen-containing organo-tungsten compound to adsorb on the feature sidewalls and exposing the substrate to a co-reactant to react with the adsorbed nitrogen-containing organo-tungsten compound. In some embodiments, exposing the substrate to a co-reactant includes exposing the substrate to a plasma. Examples of co-reactants include at least one of hydrogen ($H_2$) and ammonia ($NH_3$). Examples of nitrogen-containing organo-tungsten compound include tungsten bis(alkylimino) bis(alkylamino) compounds, $W_2(NMe_2)_6$, ethylcyclopentadienyl-dicarbonylnitrosyl-tungsten, methylcyclopentadienyl-dicarbonylnitrosyl-tungsten, and ethylcyclopentadienyl-tricarbonylhydridotungsten.

In some embodiments, the WCN film has between 50 and 80% (atomic) tungsten (W), between 3 and 35% (atomic) carbon (C), and between 1 and 45% (atomic) nitrogen (N).

Another aspect of the disclosure relates to a method involving providing a partially fabricated semiconductor device including exposed surfaces of cobalt and surrounding dielectric to a reactor; sequentially introducing a vapor phase nitrogen-containing organo-tungsten precursor and a reducing agent to the reactor; and exposing the partially fabricated semiconductor device to the vapor phase nitrogen-containing organo-tungsten precursor and reducing agent under conditions such that a tungsten carbon nitride film is selectively deposited on the exposed surfaces of cobalt.

These and further aspects are described below with reference to the drawings.

DETAILED DESCRIPTION

Provided are methods of forming diffusion barriers for cobalt (Co) interconnects. The methods involve selective deposition of tungsten carbon nitride (WCN) films on the oxide or nitride surfaces of a feature including a Co surface. The selective growth of WCN on oxide or nitride allows the contact resistance at a Co—Co interface or other Co-metal interface to be significantly reduced while maintaining good film coverage and barrier properties on the sidewall oxide or nitride surfaces.

The selective ALD WCN deposition enables relatively thick film coverage (e.g., between 5 Angstroms and 20 Angstroms) on the field and sidewall to prevent metal from diffusing into dielectrics but thin coverage on the bottom for lower contact resistance. In addition to diffusing into oxide, Co has poor adhesion on oxide. The WCN films described herein may also be used as Co-oxide or Co-nitride adhesion layers.

Figure 1:
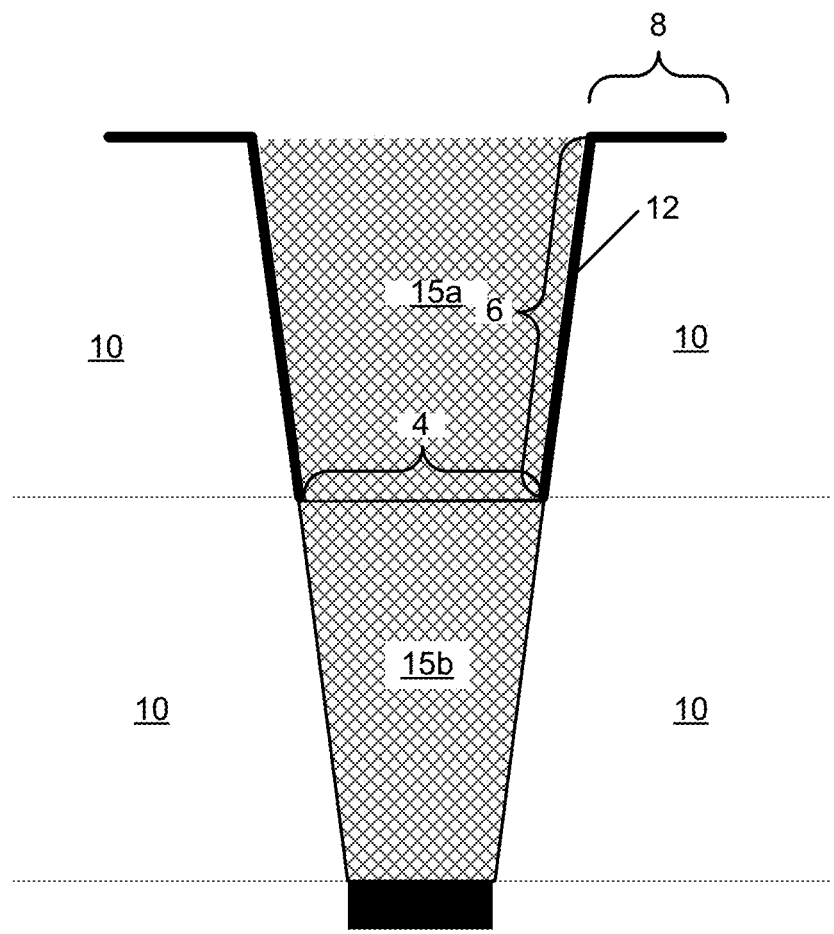
FIG. 1 shows an example of a cobalt (Co) interconnect on a tungsten carbon nitrogen (WCN) barrier layer according to various embodiments.

FIG. 1 shows an example of an interconnect on a WCN barrier layer according to various embodiments. In one example of FIG. 1, a cobalt-cobalt metal integration scheme is depicted, with an interconnect 15a providing a connection to a Co interconnect 15b. The interconnect 15a may be any appropriate metal, such as a Co interconnect, a ruthenium (Ru) interconnect, an iridium (Ir) interconnect, or a rhodium (Rh) interconnect. In certain embodiments, the interconnect 15a is a Co interconnect or Ru interconnect.

A WCN layer 12 provides a barrier between oxide 10 and the interconnect 15a. Notably, the WCN layer is selectively deposited on oxide surfaces rather than Co surfaces, such that it is thicker in the field surfaces 8 and the sidewall surfaces 6 which are oxide, than on the bottom surface 4, which is a Co surface. This is due to a deposition process described below that exhibits nucleation delay on Co surfaces, and allows a reduction in Co—Co (or Co—Ru, Co—Ir, Co—Rh, etc.) contact resistance while maintaining good film coverage on the field and sidewall. The WCN film exhibits strong adhesion to the oxide surfaces and good barrier characteristics. Selectivity refers to the preference in deposition on a dielectric oxide surface relative to a metal surface, such as Co. It may be quantified as a ratio of deposition rates or as a ratio of deposition thicknesses after a certain number of deposition cycles.

As used herein, oxide surfaces include alkoxides such as tetraethyl orthosilicate (TEOS), fluorosilicate glass (FSG), flowable oxides, spin-on-glasses, carbon doped oxides, etc. In some embodiments, the oxide surface is a silicon-based oxide with examples given above.

In some embodiments, the sidewalls and field regions surfaces are nitrides (e.g., $Si_xN_y$) rather than oxides. Selectivity of WCN deposition on nitrides is similar to that of oxides. The nitrides may be silicon-based nitrides or silicon-based oxynitrides.

Figure 2:
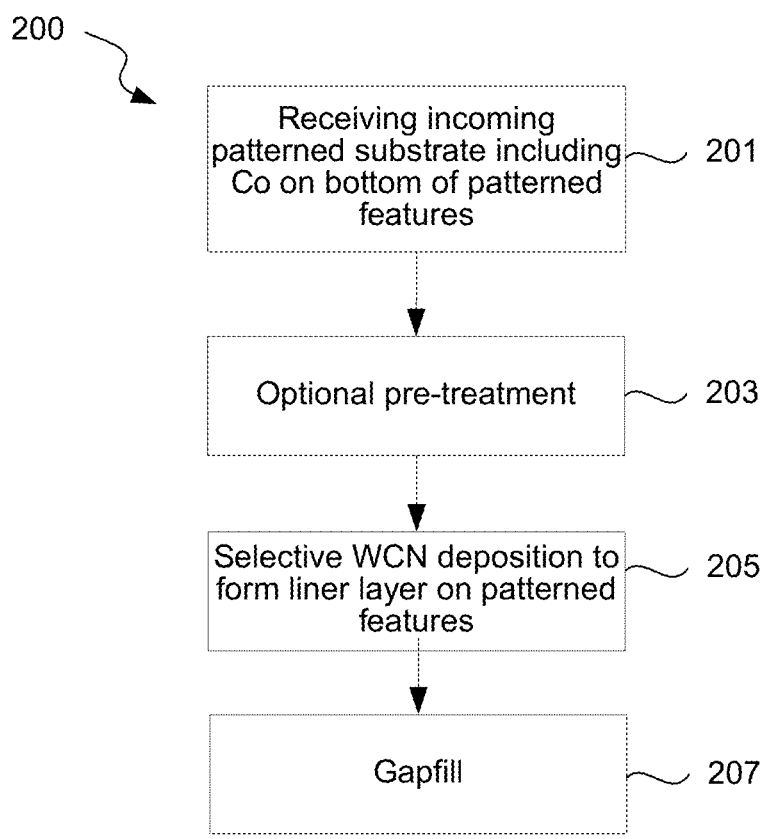
FIG. 2 shows an example of a method of forming a Co interconnect according to various embodiments.
Figure 3:
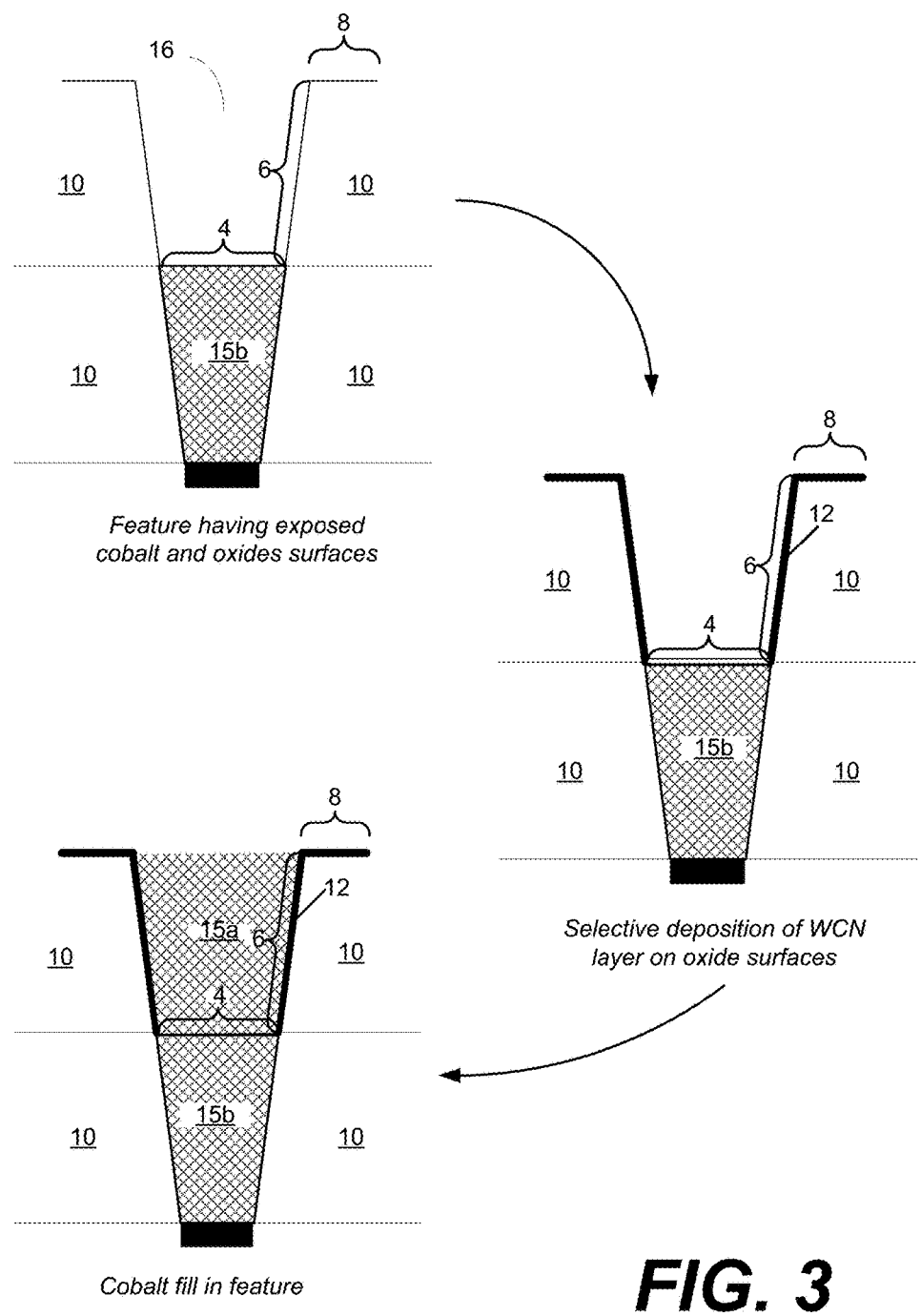
FIG. 3 shows examples of cross-sectional schematic diagrams of a patterned feature after certain operations of the methods of FIG. 2.

FIG. 2 shows an example of a method 200 of forming a Co interconnect according to various embodiments. FIG. 3 shows examples of cross-sectional schematic diagrams of a patterned feature after certain operations of the methods of FIG. 2. First, a patterned substrate including Co on the bottom of the patterned features is received. Block 201. An example of a patterned feature is shown in FIG. 3, with recess 16 formed a layer of oxide 10. The feature may be, for example, an etched feature. The feature includes sidewalls surfaces 6, which are oxide or nitride, and a bottom surface 4, which is Co. The Co surface may include a thin layer of Co oxide or impurity. If present, the Co oxide may be removed in a subsequent pre-treatment operation to leave an exposed Co surface. The patterned substrate also includes field surfaces 8, which are oxide or nitride, typically a silicon oxide such a doped or undoped silicon dioxide. The Co interconnect 15b or other Co surface may be part of any appropriate part of a partially fabricated semiconductor device, including a source/drain (S/D) connection, a middle of the line (MOL) structure or an back end of line (BEOL) structure. It may be formed by any appropriate method including plating, atomic layer deposition (ALD), chemical vapor deposition (CVD), or physical vapor deposition (PVD) techniques such as sputtering.

Returning to FIG. 2, an optional pre-treatment operation is performed. Block 203. As described below, the pre-treatment may be tailored to tune the selectivity of the subsequent WCN deposition. Next, selective WCN deposition is performed to form a liner layer on the patterned features. Block 205. Selective WCN deposition refers to deposition that is selective to the oxide or nitride surfaces with respect to the Co surface. As such, the portion of the liner layer that is formed on the oxide or nitride surfaces is thicker than that formed on the Co surface. See FIG. 3, which provides an example of selective deposition of a WCN layer 12 in the recess 16. The WCN layer 12 is thicker on the sidewall surfaces 6 than on the bottom surface 4.

As noted above, a pre-treatment may be used to tune the selectivity. As such the thickness of the WCN liner layer on the Co surface may range from less than a full layer (e.g., a discontinuous layer or no deposition) to 80% of the thickness on the oxide or nitride surfaces. While the thickness of the WCN liner layer varies according to the surface on which it is deposited, the WCN layer otherwise may be characterized by having good step coverage. For the purposes of this description, "step coverage" is defined as the ratio of the thickness on a field surface (e.g., field surfaces 8 in FIG. 1) to the ratio on the sidewall (e.g., on sidewalls surfaces 6 in FIG. 1.) As described below, deposition on the oxide or nitride surfaces is conformal, such that the step coverage is about 1:1, e.g., ranging from about 1 to 1.3:1. A sidewall thickness may be measured near the feature bottom, for example, at a position corresponding to 80% of the feature depth as measured from a field surface to the bottom surface. The deposition may also be characterized by a uniform thickness on the sidewalls. For example, the thickness may vary on the sidewall only by no more than 20%, 10%, or 5%. Selective deposition in block 205 is described further below and involves an atomic layer deposition (ALD) process using an organometallic tungsten precursor.

Once the WCN liner layer is formed, gap fill may be performed. Block 207. Gap fill involves deposition or plating of a fill metal such as Co, Ru, Ir, or Rh. In some embodiments, a seed layer (e.g., a Co seed layer) may be deposited on the WCN liner layer in some embodiments prior to gap fill (e.g., a Co gap fill). Gap fill may involve any appropriate deposition method, with chemical vapor deposition (CVD) or plating processes as examples.

Figure 4:
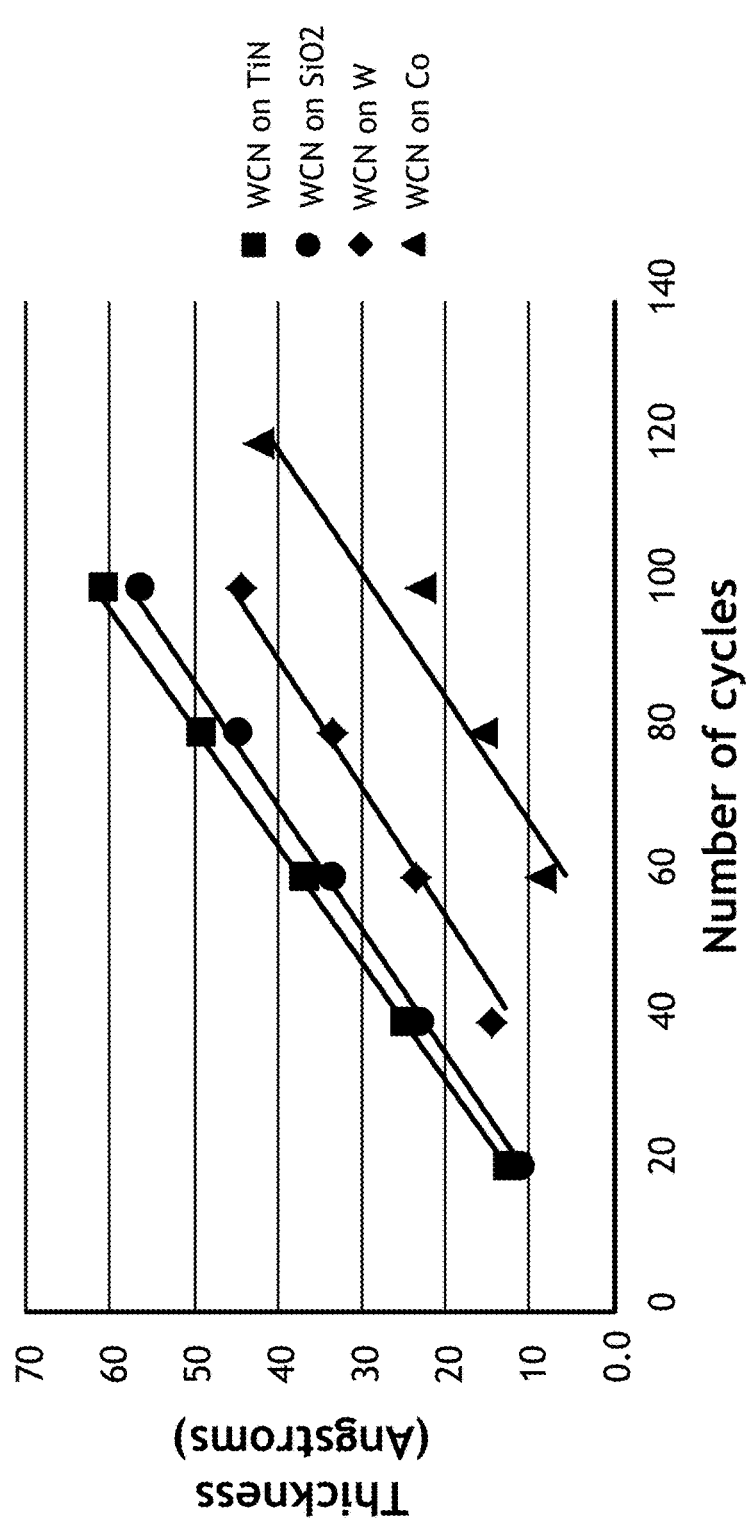
FIG. 4 shows an example of ALD growth of WCN on titanium nitride (TiN), silicon dioxide (SiO2), tungsten (W) and Co surfaces as a function of the number of ALD cycles.

As indicated, WCN exhibits selective deposition on oxide or nitride dielectric layers with respect to Co. FIG. 4 shows an example of ALD growth of WCN on titanium nitride (TiN), silicon dioxide ($SiO_2$), tungsten (W), and Co surfaces as a function of the number of ALD cycles. The TiN, W, and Co surfaces were exposed to a hydrogen-containing plasma prior to ALD deposition to reduce any surface metal oxide present. The $SiO_2$ WCN growth line may be compared to each of the TiN, W, and Co WCN growth lines to compare the relative selectivity of ALD WCN growth on $SiO_2$ with respect to TiN, W, and Co. Comparing $SiO_2$ (circles) to TiN (squares) shows that WCN is not selectively deposited on $SiO_2$ relative to TiN; ALD deposition of WCN is approximately the same on TiN and $SiO_2$, and is even somewhat faster on TiN. Comparing $SiO_2$ (circles) to W (diamonds) shows that WCN is somewhat selectively deposited on $SiO_2$ relative to W; for example, at 60 cycles, approximately 34 Angstroms is deposited on $SiO_2$ versus approximately 24 Angstroms on W. However, comparing $SiO_2$ (circles) to Co (triangles) shows significantly higher selectivity for $SiO_2$ with only approximately 9 Angstroms deposited after 60 cycles. This allows WCN ALD deposition on features including oxide and Co surfaces to be uniquely exploited to form low resistance Co—Co (or Co—Ru, etc.) contact resistance while exhibiting strong adhesion to the oxide surfaces and good barrier characteristics.

Figure 5:
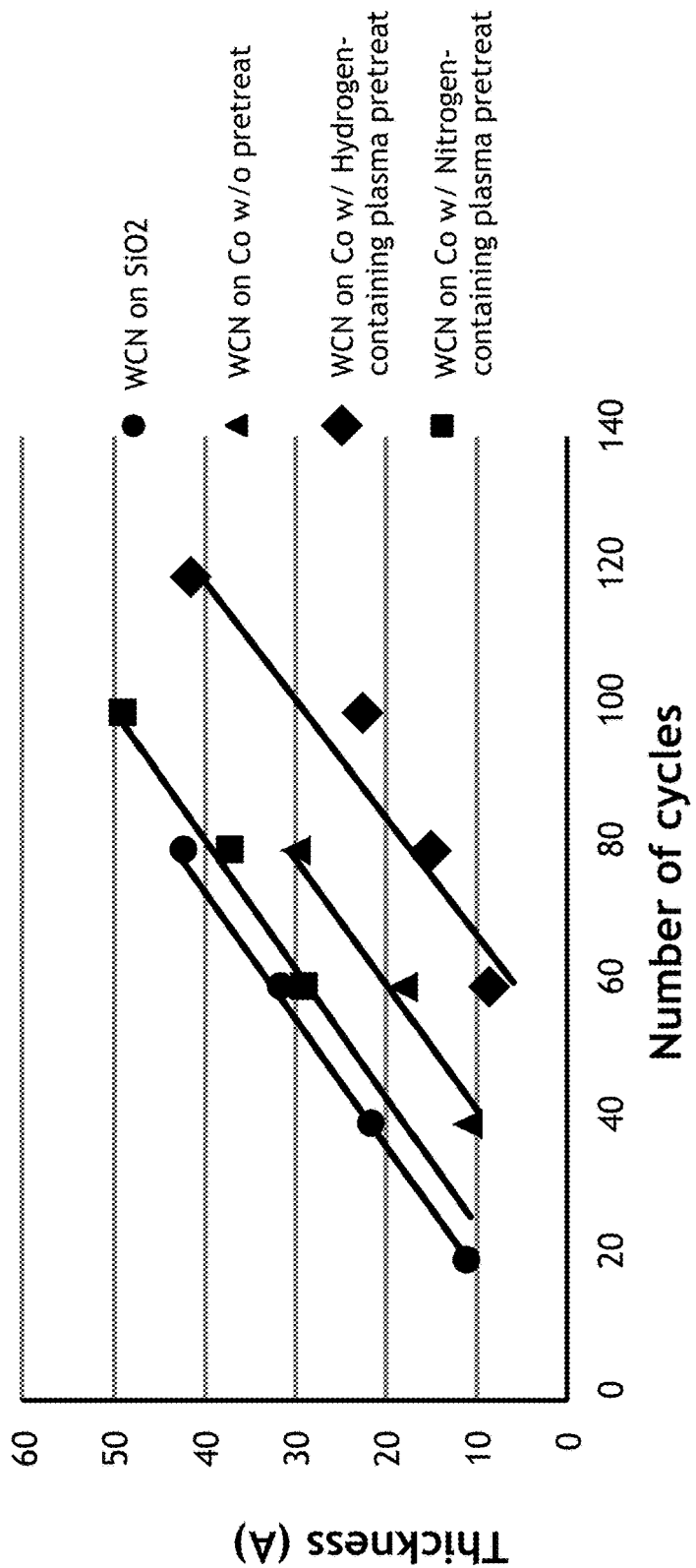
FIG. 5 shows an example of ALD growth of WCN on Co surfaces with varying pre-treatment plasma compositions and ALD growth of WCN on oxide as a function of number of ALD cycles.

Referring back to FIG. 2, in some embodiments, a pre-treatment may be employed prior to the selective deposition of WCN on oxide or nitride. See block 203. A pre-treatment may be used to tune the nucleation delay on the Co surface to thereby tune the selectivity. In particular, as shown in FIG. 5, pre-treatment with different plasma compositions results in different nucleation delays on Co surfaces, enabling selective WCN growth controllability between the oxide field regions and feature sidewalls and Co feature bottom. FIG. 5 shows an example of ALD growth of WCN on Co surfaces with varying pre-treatment plasma compositions and ALD growth of WCN on oxide as a function of number of ALD cycles.

Comparing the WCN on Co with hydrogen-containing plasma pre-treatment growth line (diamonds) to the WCN on oxide growth line (circles), it can be seen that the hydrogen-containing plasma pre-treatment resulted in the greatest selectivity. As indicated above, in some embodiments, a hydrogen-containing pre-treatment may be used to reduce any Co oxide that has formed on the Co surface. No pre-treatment (triangles) resulted in lower selectivity, but still a selective deposition, while the nitrogen-containing pre-treatment (squares) resulted in nearly eliminating the selectivity. The hydrogen-containing plasma was generated from hydrogen gas ($H_2$) and the nitrogen-containing plasma from nitrogen gas ($N_2$).

The pre-treatment, if performed, may be a plasma treatment or, in some embodiments, a thermal treatment. If a plasma treatment is performed, it may be a remote plasma or an in situ plasma. An in situ plasma refers to a plasma that is generated in a chamber that houses the substrate, generally without a filter interposed between the substrate and the generated plasma, and may include ions and radicals. A remote plasma refers to a plasma that is generated remotely from the substrate. It may be generated in a dome or other space that is part of or connected to the chamber the substrate is in or in a separate, self-contained unit. A showerhead or other filter is generally interposed between the generator and the substrate. In some embodiments, a remote plasma contains only radicals or other neutral species, with no ions.

Gases that may be fed to the plasma generator to generate the plasma may include $N_2$, $H_2$, and or a mixture of these gases to tune the selectivity. Also, as indicated above, a hydrogen-containing plasma may be used as a pre-treatment to reduce Co oxide. The presence of Co oxide at the interface can cause an undesirable increase in resistance. Referring to FIG. 5, the WCN on Co growth line without pretreatment (triangles) is selective, but not as selective as with hydrogen-containing plasma pre-treatment (diamonds). However, if there is Co oxide and this intermediate level of selectivity is desired, a pre-treatment including hydrogen (to reduce the oxide) and nitrogen (to mitigate the effects of the hydrogen pre-treatment) may be employed. In such cases, a hydrogen-containing gas and a nitrogen-containing gas may be mixed and introduced to a plasma generator, such that the substrate is exposed to a plasma that is hydrogen-containing and nitrogen-containing, or a hydrogen-containing plasma exposure may be followed by a nitrogen-containing plasma exposure. Other appropriate sequences may be employed for multi-step pre-treatments. In addition to $N_2$ and $H_2$, gases such as ammonia ($NH_3$) or ($N_2H_2$) may be employed to reduce Co oxide and/or tune selectivity in the subsequent deposition operation. An inert gas such as argon (Ar) may be present in the plasma. Any oxidizing gas such as oxygen ($O_2$) or oxygen-containing gases may be avoided to prevent forming Co oxide. In some embodiments, a bias may be applied to the substrate to facilitate charged plasma species reaching the bottom of the feature to treat the Co surface. In some embodiments, the pre-treatment may be a thermal rather than plasma process.

Figure 6:
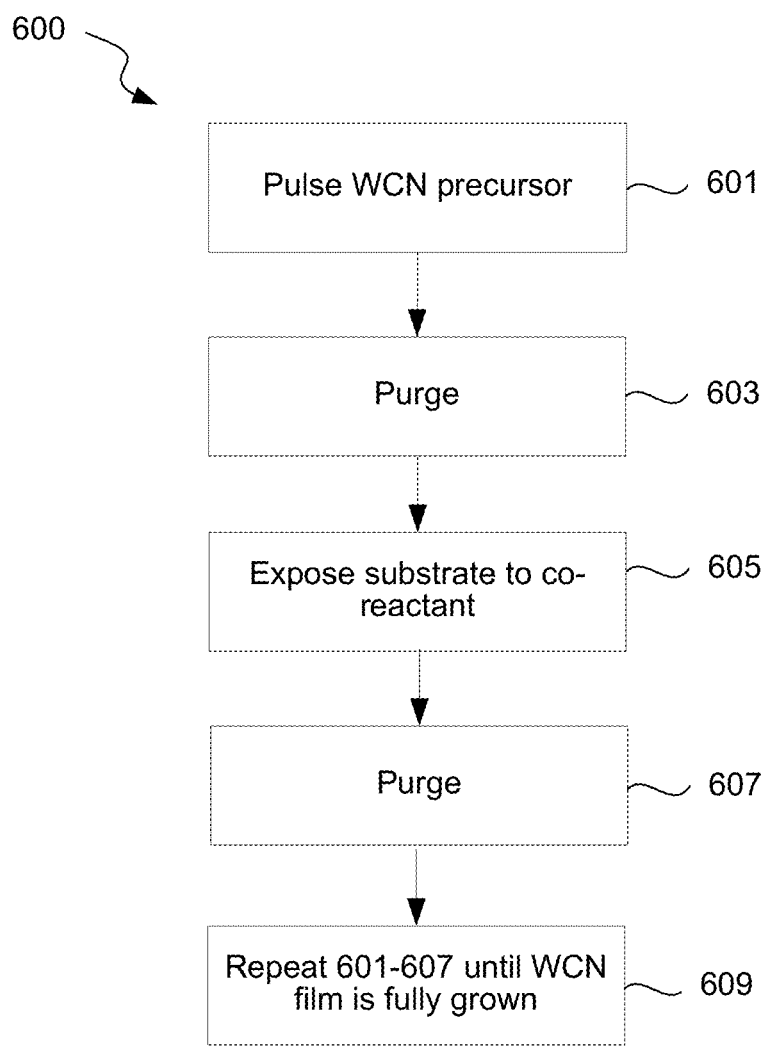
FIG. 6 shows an example of a method of selectively depositing a WCN layer by ALD according to various embodiments.

The selective deposition may be performed in the same or a different chamber than the pre-treatment (if performed). If in a different chamber, the two chambers may be under a common vacuum to avoid exposure to air and possible oxide formation during transfer. In the ALD method, the substrate may be exposed in cycles such that the substrate is first exposed to a pulse of a suitable WCN precursor, then the precursor is purged, then the substrate is exposed to a pulse of a plasma containing a co-reactant, and then the co-reactant is purged, and such cycles may be repeated until a desired thickness of WCN is formed on the oxide or nitride. The substrate temperature may be between about 100° C. and about 450° C., or between about 250° C. and about 400° C. FIG. 6 shows an example of a method 600 of selectively depositing a WCN layer by ALD according to various embodiments. The method 600 may be performed during block 205 of FIG. 2, in some embodiments.

First, a WCN precursor is pulsed. Block 601. The WCN precursor may be adsorbed onto the surface of the substrate, including on patterned features that include Co and oxide or nitride surfaces. The WCN precursor may be a nitrogen-containing organo-tungsten compound, e.g., an organo-tungsten compound containing N-substituted amino and/or imino groups. Tungsten, carbon and nitrogen in the deposited film are supplied by the WCN precursor. In circumstances in which a greater nitrogen concentration is desired, additional nitrogen can be supplied by using a nitrogen-containing reducing agent such as ammonia ($NH_3$). In particular embodiments, a tungsten bis(alkylimino)bis(alkylamino) compound is used to selectively deposit a $WN_x$ film. Such compounds have the following structure:

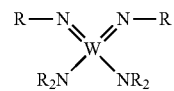

According to various embodiments, each R may be independently selected from methyl, ethyl, propyl, butyl and tert-butyl groups. These groups may be substituted or unsubstituted, though are typically unsubstituted. In a particular embodiment, the tungsten nitride precursor is bis(tert-butylimino) bis(dimethylamino) tungsten ($W[N(C_4H_9)]_2[N(CH_3)_2]_2$), which has the following structure:

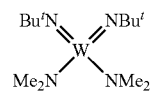

It should be noted that these imino and amino groups are also referred to as imido and amido groups in various publications, including the certain of the following referenced publications. For the purposes of this specification, imido and imino are used to refer to =NR groups and amido and amino are used to refer to —$NR_2$ groups. Non-selective deposition of tungsten nitride using bis(tert-butylimino) bis(dimethylamino) is described in the following publications: "Highly Conformal Thin Films of Tungsten Nitride Prepared by Atomic Layer Deposition from a Novel Precursor," Becker et al., Chem. Mater., 2003, 15, 2969-2976 and "Diffusion barrier properties of tungsten nitride films grown by atomic layer deposition from bis(tert-butylimido) bis(dimethylamido)tungsten and ammonia," Becker et al., Applied Physics Letters, 2003, 82(14), 2239-2241, which are hereby incorporated by reference. Non-selective deposition of tungsten nitride using bis(tert-butylimido)bis(tert-butylamido)tungsten is described in "Kinetic and Mechanistic Studies of the Chemical Vapor Deposition of Tungsten Nitride from Bis(Tertbutylimido)Bis(Tertbutylamido) tungsten," Crane et al., J. Phys. Chem. B 2001, 105, 3549-3556 and "Tungsten nitride thin films prepared by MOCVD," J. Mater. Res., 8(6), June 1993, 1353-1360. These references are incorporated by reference. Further examples include $W_2(NMe_2)_6$, ethylcyclopentadienyl-dicarbonylnitrosyl-tungsten (EDNOW), methylcyclopentadienyl-dicarbonylnitrosyl-tungsten (MDNOW), and ethylcyclopentadienyl-tricarbonylhydridotungsten (ETHW), available from Praxair. Next, a purge operation may be performed. Block 603. A purge operation may involve flowing Ar or other inert gas and can result in excess (non-adsorbed) WCN precursor from being removed from the chamber. In some embodiments, a purge may not be performed.

The substrate is then exposed to a co-reactant. Block 605. In some embodiments, this is in the form of a reducing plasma. Examples of reducing agents that may be used to generate a plasma include $H_2$ and $NH_3$. Other reducing agents may be used including $N_2H_2$. In some embodiments, both $H_2$ and $NH_3$ are employed, either together or in sequence. In some embodiments, a reducing agent is pulsed and a plasma is ignited timed with the pulse. In some embodiments, the reducing agent (or multiple reducing agents) may be flowed throughout the process with a plasma ignited periodically. The plasma may be an inductively-coupled plasma (ICP) or a capacitively-coupled plasma (CCP), and may be a direct plasma or a remote plasma. In some embodiments, a thermal (non-plasma) ALD process is used. In such embodiments, other reducing agents may be employed such as boranes, silanes, and germanes, in addition to the reducing agents described above. In various embodiments, the WCN precursor and/or reducing agent are introduced into the chamber using a carrier gas, such as Ar or $N_2$. In some embodiments, a nitrogen-containing gas (such as $N_2$) may be used to incorporate nitrogen in the film. Such a gas may be pulsed with the reducing agent or reducing agents, or as an additional pulse.

The co-reactant reacts with the adsorbed WCN precursor to form a WCN film. The WCN film composition may vary, with for example, between 50 and 80% (atomic) W, between 3 and 35% (atomic) carbon, and between 1 and 45% (atomic) nitrogen. In alternate embodiments, there may be less than 1% (atomic) nitrogen present, such that the deposited barrier film is a tungsten carbide (WC) film instead of a WCN film.

Returning to FIG. 6, the chamber is purge again. Block 607. This may be performed after the plasma (if used) is extinguished and can remove excess reactant and byproducts. In some embodiments, a purge may not be performed. Operations 601-607 may form a deposition cycle or part thereof that selectively deposits WCN on oxide or nitride with respect to Co. Operations 601-607 may be repeated in sequence until the WCN film is fully grown. Block 609. For a 10 nm feature opening, there may be, for example, 10 Angstroms of film on the sidewalls and field regions of the feature, and between 0 and 5 Angstroms on the feature bottom. The ratio of the thickness of the WCN on the oxide or nitride to the thickness on the Co may be at least 2:1, at least 3:1, at least 5:1, or at least 10:1 in some embodiments.

As indicated above, WCN is good diffusion barrier to prevent the diffusion of Co into oxide. Planar capacitor (Pcap) structures were used to test WCN as a diffusion barrier. Table 1, below, shows pCAP test film stacks for two wafers, with wafer 1 having a 1 nm WCN barrier and wafer 2 having a 2 nm WCN barrier. The WCN films were approximately 55% W, 25% N and 20% C. Bis(tert-butylimino)bis(dimethylamino) was used as the WCN precursor, with $H_2$ and/or $NH_3$ as the co-reactant.

TABLE 1

| | Dielectric $SiO_2$ | WCN Barrier | Co | TaN/Ta | PVD Cu | Cu CMP | Passivation |
|---|---|---|---|---|---|---|---|
| Wafer 1 | 40 nm | 1 nm | 4 nm | 3 nm/ 3 nm | 500 nm | Yes | Yes |
| Wafer 2 | 40 nm | 2 nm | 4 nm | 3 nm/ 3 nm | 500 nm | Yes | Yes |

The results of the tests are shown in Table 2, below.

TABLE 2

| | k value | $+V_{BD}$ | $-V_{BD}$ |
|---|---|---|---|
| Wafer 1 | 4.26 ± 0.05 | 39.58 ± 0.38 | −39.17 ± 0.40 |
| Wafer 2 | 4.22 ± 0.06 | 39.12 ± 0.44 | −38.85 ± 0.85 |

Similar k values and similar $+V_{BD}$ and $-V_{BD}$ were observed for both the 1 nm WCN and the 2 nm WCN. Early breakdown due to Co diffusion into oxide through WCN was not observed. This indicates that 1 nm of WCN is a good diffusion barrier for Co into oxide.

WCN also shows a strong adhesion to oxide. Table 3, below, shows results of scrap tape adhesion testing for various TEOS/WCN/Co seed/electroplated Co stacks.

TABLE 3

| Stack | Substrate | WCN (nm) | Co seed (nm) | Co electroplating (nm) | Post-plating anneal under forming gas | Scrap tape adhesion test |
|---|---|---|---|---|---|---|
| 1 | 1 kÅ TEOS | 1 | 3 | 400 | 400° C., 5 min | Pass |
| 2 | 1 kÅ TEOS | 1 | 4 | 400 | 400° C., 5 min | Pass |
| 3 | 1 kÅ TEOS | 2 | 3 | 400 | 400° C., 5 min | Pass |

10 Angstroms of WCN showed strong adhesion to the oxide even after 400 nm of Co plating.

As shown above with respect to FIGS. 4 and 5, ALD WCN can be performed such that there is significant nucleation delay on Co. To demonstrate WCN selectivity on oxide with respect to Co, 3 cycles of 30 Angstrom ALD WCN (target) and 40 Angstrom CVD Co were formed on native oxide of a silicon substrate. The target thickness assuming no nucleation delay is shown in FIG. 7A.

Figures 7A, 7B:
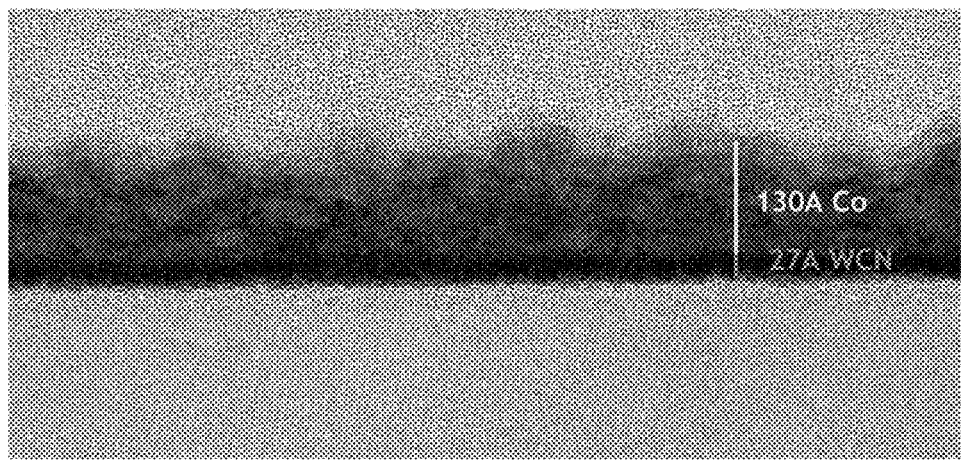
FIG. 7A shows a target silicon oxide/WCN/Co film stack assuming no nucleation delay for an example deposition.
FIG. 7B shows a scanning electron microscope (SEM) image that shows the results of the example deposition of FIG. 7A. The image indicates significant nucleation delay on WCN and little or no delay on native silicon oxide.

FIG. 7B shows a transmission electron microscope (TEM) image that shows the results of the example deposition of FIG. 7A. The image indicates significant nucleation delay of WCN on Co and little or no delay on native silicon oxide. The image shows 27 Angstroms of WCN on the native oxide, and 130 Angstroms of CVD Co on the WCN layer, with no or only very thin and unobservable WCN layers in the Co layer.

Apparatus

Figure 8:
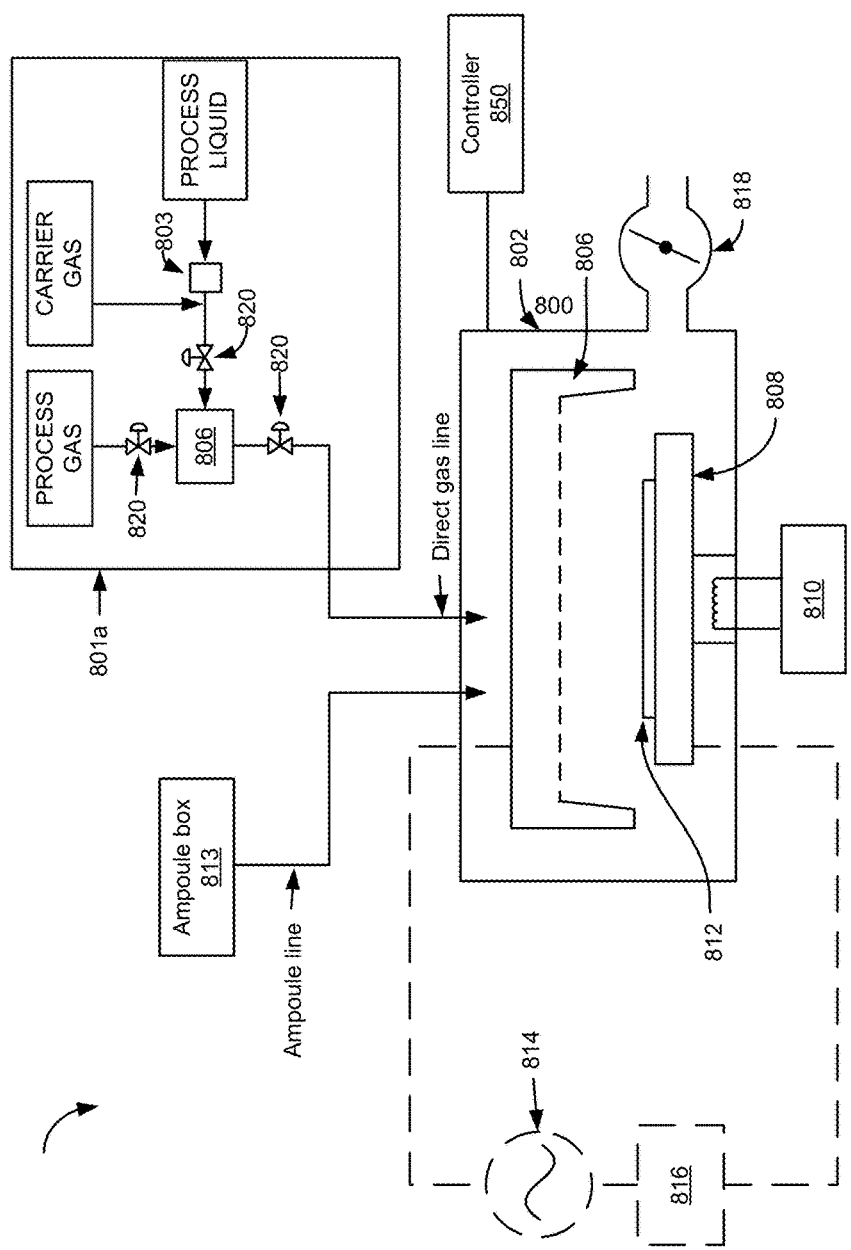
FIG. 8 is a schematic diagram of an example process chamber for performing certain disclosed embodiments.
Figure 9:
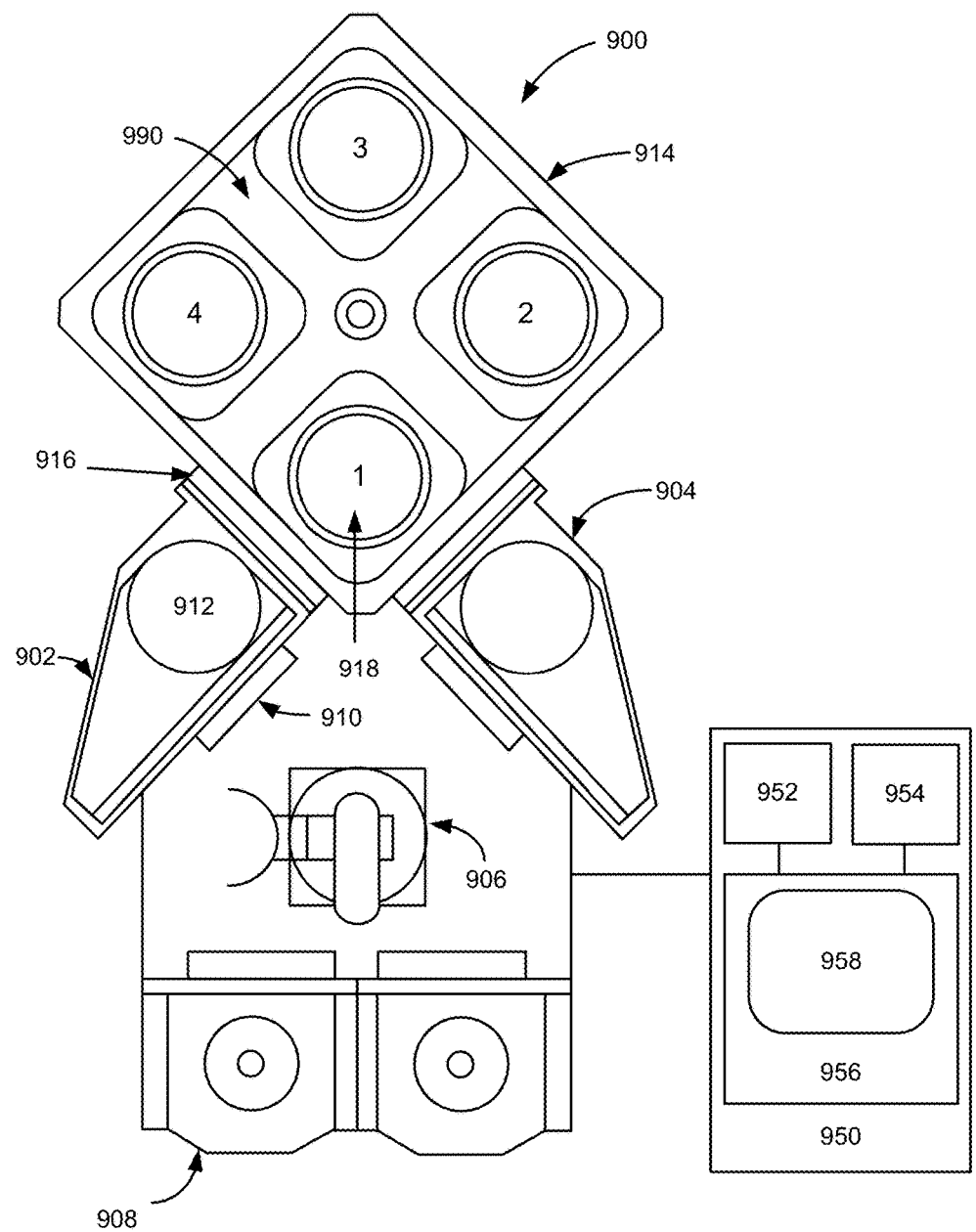
FIG. 9 is a schematic diagram of an example process tool for performing certain disclosed embodiments.

FIG. 8 depicts a schematic illustration of an embodiment of an ALD process station 800 having a process chamber 802 for maintaining a low-pressure environment. A plurality of ALD process stations may be included in a common low pressure process tool environment. For example, FIG. 9 depicts an embodiment of a multi-station processing tool 900. In some embodiments, one or more hardware parameters of ALD process station 800, including those discussed in detail below, may be adjusted programmatically by one or more computer controllers 850.

ALD process station 800 fluidly communicates with reactant delivery system 801a for delivering process gases to a distribution showerhead 806. Reactant delivery system 801a includes a mixing vessel 804 for blending and/or conditioning process gases, such as a WCN precursor-containing gas, hydrogen-containing gas, or nitrogen-containing gas, for delivery to showerhead 806. One or more mixing vessel inlet valves 820 may control introduction of process gases to mixing vessel 804. In various embodiments, selective deposition of a WCN film is performed in process station 800 and in some embodiments, other operations such as pre-treatment, Co seed layer deposition, or Co gap fill may be performed in the same or another station of the multi-station processing tool 900 as further described below with respect to FIG. 9.

As an example, the embodiment of FIG. 8 includes a vaporization point 803 for vaporizing liquid reactant to be supplied to the mixing vessel 804. In some embodiments, vaporization point 803 may be a heated vaporizer. In some embodiments, a liquid precursor or liquid reactant may be vaporized at a liquid injector (not shown). For example, a liquid injector may inject pulses of a liquid reactant into a carrier gas stream upstream of the mixing vessel 804. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 806.

In some embodiments, a liquid flow controller (LFC) upstream of vaporization point 403 may be provided for controlling a mass flow of liquid for vaporization and delivery to process chamber 802. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 806 distributes process gases toward substrate 812. In the embodiment shown in FIG. 8, the substrate 812 is located beneath showerhead 806 and is shown resting on a pedestal 808. Showerhead 806 may have any suitable shape, and may have any suitable number and arrangement of ports for distributing process gases to substrate 812.

In some embodiments, pedestal 808 may be raised or lowered to expose substrate 812 to a volume between the substrate 812 and the showerhead 806. In some embodiments, pedestal 808 may be temperature controlled via heater 810. Pedestal 808 may be set to any suitable temperature, such as between about 25° C. and about 650° C. during operations for performing various disclosed embodiments. It will be appreciated that, in some embodiments, pedestal height may be adjusted programmatically by a suitable computer controller 850. At the conclusion of a process phase, pedestal 808 may be lowered during another substrate transfer phase to allow removal of substrate 812 from pedestal 808.

In some embodiments, a position of showerhead 806 may be adjusted relative to pedestal 808 to vary a volume between the substrate 812 and the showerhead 806. Further, it will be appreciated that a vertical position of pedestal 808 and/or showerhead 806 may be varied by any suitable mechanism within the scope of the present disclosure. In some embodiments, pedestal 808 may include a rotational axis for rotating an orientation of substrate 812. It will be appreciated that, in some embodiments, one or more of these example adjustments may be performed programmatically by one or more suitable computer controllers 850. The computer controller 850 may include any of the features described below with respect to controller 950 of FIG. 9.

In some embodiments where plasma may be used as discussed above, showerhead 806 and pedestal 808 electrically communicate with a radio frequency (RF) power supply 814 and matching network 816 for powering a plasma. In some embodiments, the plasma energy may be controlled by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Likewise, RF power supply 814 may provide RF power of any suitable frequency. In some embodiments, RF power supply 814 may be configured to control high- and low-frequency RF power sources independently of one another. Example low-frequency RF frequencies may include, but are not limited to, frequencies between 0 kHz and 900 kHz. Example high-frequency RF frequencies may include, but are not limited to, frequencies between 1.8 MHz and 2.45 GHz, or greater than about 13.56 MHz, or greater than 27 MHz, or greater than 80 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 850 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a WCN precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as $H_2$ or $NH_3$, instructions for modulating the flow rate of a carrier or purge gas, instructions for igniting a plasma, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the present disclosure.

Further, in some embodiments, pressure control for process station 800 may be provided by butterfly valve 818. As shown in the embodiment of FIG. 8, butterfly valve 818 throttles a vacuum provided by a downstream vacuum pump (not shown). However, in some embodiments, pressure control of process station 800 may also be adjusted by varying a flow rate of one or more gases introduced to the process station 800.

As described above, one or more process stations may be included in a multi-station processing tool. FIG. 9 shows a schematic view of an embodiment of a multi-station processing tool 900 with an inbound load lock 902 and an outbound load lock 904, either or both of which may include a remote plasma source (not shown). A robot 906, at atmospheric pressure, is configured to move wafers from a cassette loaded through a pod 908 into inbound load lock 902 via an atmospheric port 910. A wafer (not shown) is placed by the robot 906 on a pedestal 912 in the inbound load lock 902, the atmospheric port 910 is closed, and the load lock inbound 902 is pumped down. Where the inbound load lock 902 includes a remote plasma source, the wafer may be exposed to a remote plasma treatment in the inbound load lock 902 prior to being introduced into a processing chamber 914. Further, the wafer also may be heated in the inbound load lock 902 as well, for example, to remove moisture and adsorbed gases. Next, a chamber transport port 916 to processing chamber 914 is opened, and another robot (not shown) places the wafer into the reactor on a pedestal of a first station shown in the reactor for processing. While the embodiment depicted in FIG. 9 includes load locks, it will be appreciated that, in some embodiments, direct entry of a wafer into a process station may be provided.

The depicted processing chamber 914 includes four process stations, numbered from 1 to 8 in the embodiment shown in FIG. 9. Each station has a heated pedestal (shown at 918 for station 1), and gas line inlets. It will be appreciated that in some embodiments, each process station may have different or multiple purposes. For example, in some embodiments, a process station may be switchable between an ALD and plasma-enhanced ALD process mode. In some embodiments, exposure to a deposition precursor and exposure to a second reactant and plasma are performed in the same station. Additionally or alternatively, in some embodiments, processing chamber 914 may include one or more matched pairs of ALD and plasma-enhanced ALD process stations. Further, exposure to a pre-treatment gas or plasma and an ALD process may occur in the same or different stations. While the depicted processing chamber 914 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 9 depicts an embodiment of a wafer handling system 990 for transferring wafers within processing chamber 914. In some embodiments, wafer handling system 990 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 950 employed to control process conditions and hardware states of process tool 900. System controller 950 may include one or more memory devices 956, one or more mass storage devices 954, and one or more processors 952. Processor 952 may include a CPU or computer, analog, and/or digital input/output connections, stepper motor controller boards, etc.

In some embodiments, system controller 950 controls all of the activities of process tool 900. System controller 950 executes system control software 958 stored in mass storage device 954, loaded into memory device 956, and executed on processor 952. Alternatively, the control logic may be hard coded in the controller 950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 958 may include instructions for controlling the timing, mixture of gases, gas flow rates, chamber and/or station pressure, chamber and/or station temperature, plasma exposure duration, UV radiation duration, wafer temperature, target power levels, RF power levels, substrate pedestal, chuck and/or susceptor position, and other parameters of a particular process performed by process tool 900. System control software 958 may be configured in any suitable way. For example, various process tool component subroutines or control objects may be written to control operation of the process tool components used to carry out various process tool processes. System control software 958 may be coded in any suitable computer readable programming language.

In some embodiments, system control software 958 may include input/output control (IOC) sequencing instructions for controlling the various parameters described above. Other computer software and/or programs stored on mass storage device 954 and/or memory device 956 associated with system controller 950 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 918 and to control the spacing between the substrate and other parts of process tool 900.

A process gas control program may include code for controlling gas composition (e.g., organo-tungsten compound-containing gases, co-reactant gases, gases for performing a pre-treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 950. The user interface may include a display screen, graphical software displays of the apparatus and/or process conditions, and user input devices such as pointing devices, keyboards, touch screens, microphones, etc.

In some embodiments, parameters adjusted by system controller 950 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 950 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 950 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 950.

In some implementations, the system controller 950 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 950, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 950 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 950 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 950, in some implementations, may be a part of or coupled to a computer that is integrated with, coupled to the system, otherwise networked to the system, or a combination thereof. For example, the system controller 950 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 950 receives instructions in the form of data, which specify parameters for each of the processing steps to be performed during one or more operations. It should be understood that the parameters may be specific to the type of process to be performed and the type of tool that the system controller 950 is configured to interface with or control. Thus as described above, the system controller 950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

While FIGS. 8 and 9 provide examples of chambers and tools that may be used to perform the methods disclosed herein, various modifications may be made. These include the use of any CCP or ICP plasma generator or the use of a remote plasma generator.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 950 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate comprising a feature having a feature bottom and feature sidewalls, wherein the feature bottom comprises an cobalt surface and the feature sidewalls comprise silicon oxide or silicon nitride surfaces;
performing multiple cycles of an atomic layer deposition (ALD) process to deposit a tungsten carbon nitride (WCN) film to line the feature sidewalls, wherein a thickness of the WCN film on the silicon oxide or silicon nitride surfaces of the feature sidewalls is at least twice as thick as a thickness of the WCN film on the cobalt surface of the feature bottom; and further comprising, prior to performing the multiple cycles of the ALD deposition process, exposing the feature to a hydrogen-containing plasma and after exposing the feature to the hydrogen-containing plasma and prior to performing the multiple cycles of the ALD deposition process, exposing the feature to a nitrogen-containing plasma.

2. The method of claim 1, wherein the thickness of the WCN film on the silicon oxide or silicon nitride surfaces of the feature sidewalls is at least five times as thick as the thickness of the WCN film on the cobalt surface of the feature bottom.

3. The method of claim 1, further comprising, after depositing the WCN film, filling the feature with cobalt or ruthenium.

4. The method of claim 1, wherein the feature includes a feature opening and the substrate includes a field region adjacent to the feature opening, the field region having a silicon oxide or silicon nitride surface.

5. The method of claim 4, wherein the ALD process deposits the WCN film on the silicon oxide or silicon nitride surface of the field region.

6. The method of claim 5, wherein a thickness of the WCN film on the silicon oxide or silicon nitride surface of the field region is no more than 30% greater than a thickness of the WCN film on a silicon oxide or silicon nitride surface of the feature sidewalls.

7. The method of claim 1, wherein a thickness of the WCN film on the feature sidewalls varies no more than about 20%.

8. The method of claim 1, wherein each cycle of the ALD process comprises introducing a pulse of a nitrogen-containing organo-tungsten compound to adsorb on the feature sidewalls and exposing the substrate to a co-reactant to react with the adsorbed nitrogen-containing organo-tungsten compound.

9. The method of claim 8, wherein exposing the substrate to a co-reactant comprises exposing the substrate to a plasma.

10. The method of claim 8, wherein the co-reactant is at least one of $H_2$ and $NH_3$.

11. The method of claim 8, wherein the nitrogen-containing organo-tungsten compound is a tungsten bis(alkylimino) bis(alkylamino) compound.

12. The method of claim 1, wherein each cycle of the ALD process comprises introducing a pulse of an organo-tungsten compound to absorb on the feature sidewalls and exposing the substrate to a co-reactant to react with the adsorbed organo-tungsten compound wherein the organo-tungsten compound is selected from: $W_2(NMe_2)_6$, ethylcyclopentadienyl-dicarbonylnitrosyl-tungsten, methylcyclopentadienyl-dicarbonylnitrosyl-tungsten, and ethylcyclopentadienyl-tricarbonylhydridotungsten.

13. The method of claim 1, wherein the WCN film has between 50 and 80% (atomic) tungsten (W), between 3 and 35% (atomic) carbon (C), and between 1 and 45% (atomic) nitrogen (N).

14. The method of claim 1, wherein each cycle of the ALD process comprises introducing a pulse of a nitrogen-containing organo-tungsten compound to adsorb on the feature sidewalls and exposing the substrate to a co-reactant to react with the adsorbed nitrogen-containing organo-tungsten compound.

15. A method comprising:
providing a substrate comprising a feature having a feature bottom and feature sidewalls, wherein the feature bottom comprises an cobalt surface and the feature sidewalls comprise silicon oxide or silicon nitride surfaces;

performing multiple cycles of an atomic layer deposition (ALD) process to deposit a tungsten carbon nitride (WCN) film to line the feature sidewalls, wherein a thickness of the WCN film on the silicon oxide or silicon nitride surfaces of the feature sidewalls is at least twice as thick as a thickness of the WCN film on the cobalt surface of the feature bottom; and further comprising, prior to performing the multiple cycles of the ALD deposition process, exposing the feature to a hydrogen-containing plasma.

16. The method of claim 15, wherein the thickness of the WCN film on the silicon oxide or silicon nitride surfaces of the feature sidewalls is at least five times as thick as the thickness of the WCN film on the cobalt surface of the feature bottom.

17. The method of claim 15, further comprising, after depositing the WCN film, filling the feature with cobalt or ruthenium.

18. The method of claim 15, wherein the feature includes a feature opening and the substrate includes a field region adjacent to the feature opening, the field region having a silicon oxide or silicon nitride surface.

19. The method of claim 18, wherein the ALD process deposits the WCN film on the silicon oxide or silicon nitride surface of the field region.

20. The method of claim 19, wherein a thickness of the WCN film on the silicon oxide or silicon nitride surface of the field region is no more than 30% greater than a thickness of the WCN film on a silicon oxide or silicon nitride surface of the feature sidewalls.

* * * * *